(12) United States Patent
Miyazawa

(10) Patent No.: US 10,006,431 B2
(45) Date of Patent: Jun. 26, 2018

(54) SEMICONDUCTOR APPARATUS

(71) Applicant: FUJI ELECTRIC CO., LTD., Kanagawa (JP)

(72) Inventor: Shigemi Miyazawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days. days.

(21) Appl. No.: 15/641,345

(22) Filed: Jul. 5, 2017

(65) Prior Publication Data

US 2018/0017033 A1 Jan. 18, 2018

(30) Foreign Application Priority Data

Jul. 12, 2016 (JP) .................................. 2016-137885
Nov. 9, 2016 (JP) .................................. 2016-218920
Jun. 19, 2017 (JP) .................................. 2017-119831

(51) Int. Cl.
| | | |
|---|---|---|
| *H01T 15/00* | (2006.01) | |
| *F02P 3/04* | (2006.01) | |
| *H03K 17/30* | (2006.01) | |
| *H01L 29/739* | (2006.01) | |
| *H01L 29/78* | (2006.01) | |

(52) U.S. Cl.
CPC .......... *F02P 3/0435* (2013.01); *H03K 17/302* (2013.01); *H01L 29/7395* (2013.01); *H01L 29/7802* (2013.01)

(58) Field of Classification Search
CPC . H01T 15/00; H01L 27/0635; H01L 29/7395; H01L 2924/0002; H01L 2924/00; H01L 29/0623; H01L 29/7802; H01L 23/34; H01L 27/0248; H01L 27/0623

USPC ............ 123/644, 630, 651, 143 B, 146.5 A, 123/406.66

See application file for complete search history.

(56) References Cited

U.S. PATENT DOCUMENTS

| | | | | |
|---|---|---|---|---|
| 2004/0252432 A1* | 12/2004 | Sasaki | .................... | B60K 6/485 361/91.1 |
| 2005/0252496 A1* | 11/2005 | Ando | .................... | F02P 3/0552 123/644 |
| 2006/0022609 A1* | 2/2006 | Yukutake | .............. | F02P 3/0552 315/209 T |

(Continued)

FOREIGN PATENT DOCUMENTS

| | | |
|---|---|---|
| JP | 2009-284420 A | 12/2009 |
| JP | 2015-177328 A | 10/2015 |

*Primary Examiner* — Douglas W Owens
*Assistant Examiner* — Wei Chan

(57) ABSTRACT

A semiconductor apparatus is provided, comprising a power semiconductor element which is connected between a first terminal on a high-potential side and a second terminal on a low-potential side and is controlled to be turned on or off according to a gate potential, a cut-off condition detection section which detects whether or not a control signal that is input from a control terminal and controls the power semiconductor element satisfies a predetermined cut-off condition, and a cut-off circuit which controls the gate potential of the power semiconductor element to be an OFF potential in response to the cut-off condition detection section detecting that the cut-off condition is satisfied, and the cut-off condition detection section has an input terminal connected to the first terminal and the control terminal, and uses an electrical signal input from the input terminal as a power source.

15 Claims, 13 Drawing Sheets

(56) References Cited

U.S. PATENT DOCUMENTS

2009/0289670 A1 11/2009 Toyoda et al.
2015/0263491 A1 9/2015 Miyazawa

\* cited by examiner

132

SEMICONDUCTOR APPARATUS

The contents of the following Japanese patent applications are incorporated herein by reference:
NO. 2016-137885 filed on Jul. 12, 2016,
NO. 2016-218920 filed on Nov. 9, 2016, and.
NO. 2017-119831 filed on Jun. 19, 2017.

BACKGROUND

1. Technical Field

The present invention relates to semiconductor apparatuses.

2. Related Art

Conventionally, a power semiconductor device dealing with large power has been known as a semiconductor apparatus used for an ignition and the like of an internal combustion engine (for example, refer to Patent Document 1). It is desirable that a circuit to drive such a power semiconductor device can prevent a malfunction where the power semiconductor device is still set to an ON state even though a cut-off signal to set the power semiconductor device to an OFF state has been received.

[Patent Document 1] Japanese Patent Application Publication NO. 2009-284420

If such a drive circuit of the power semiconductor device continues operating in a state where the malfunction occurs and the abnormality remains, defects and the like may occur not only in the drive circuit but also in the internal combustion engine and the like connected to the drive circuit. Therefore, it has been desired that the drive circuit has a function to surely cut off the power semiconductor device when the cut-off signal is input.

SUMMARY

Here, a purpose of one aspect of the technological innovation included in the present specification is to provide a semiconductor apparatus which can solve the above-described problem. This purpose is achieved by combinations of characteristics according to the claims. That is, in a first aspect of the present invention, a semiconductor apparatus is provided, the semiconductor apparatus comprising a power semiconductor element which is connected between a first terminal on a high-potential side and a second terminal on a low-potential side and is controlled to be turned on or off according to a gate potential, a cut-off condition detection section which detects whether or not a control signal that is input from a control terminal and controls the power semiconductor element satisfies a predetermined cut-off condition, and a cut-off circuit which controls the gate potential of the power semiconductor element to be an OFF potential in response to the cut-off condition detection section detecting that the cut-off condition is satisfied, and the cut-off condition detection section has an input terminal connected to the first terminal and the control terminal and uses an electrical signal input from the input terminal as a power source.

The summary clause does not necessarily describe all necessary features of the embodiments of the present invention. The present invention may also be a sub-combination of the features described above.

DESCRIPTION OF EXEMPLARY EMBODIMENTS

The embodiments do not limit the invention according to the claims, and all the combinations of the features described in the embodiments are not necessarily essential to means provided by aspects of the invention.

Figure 1:
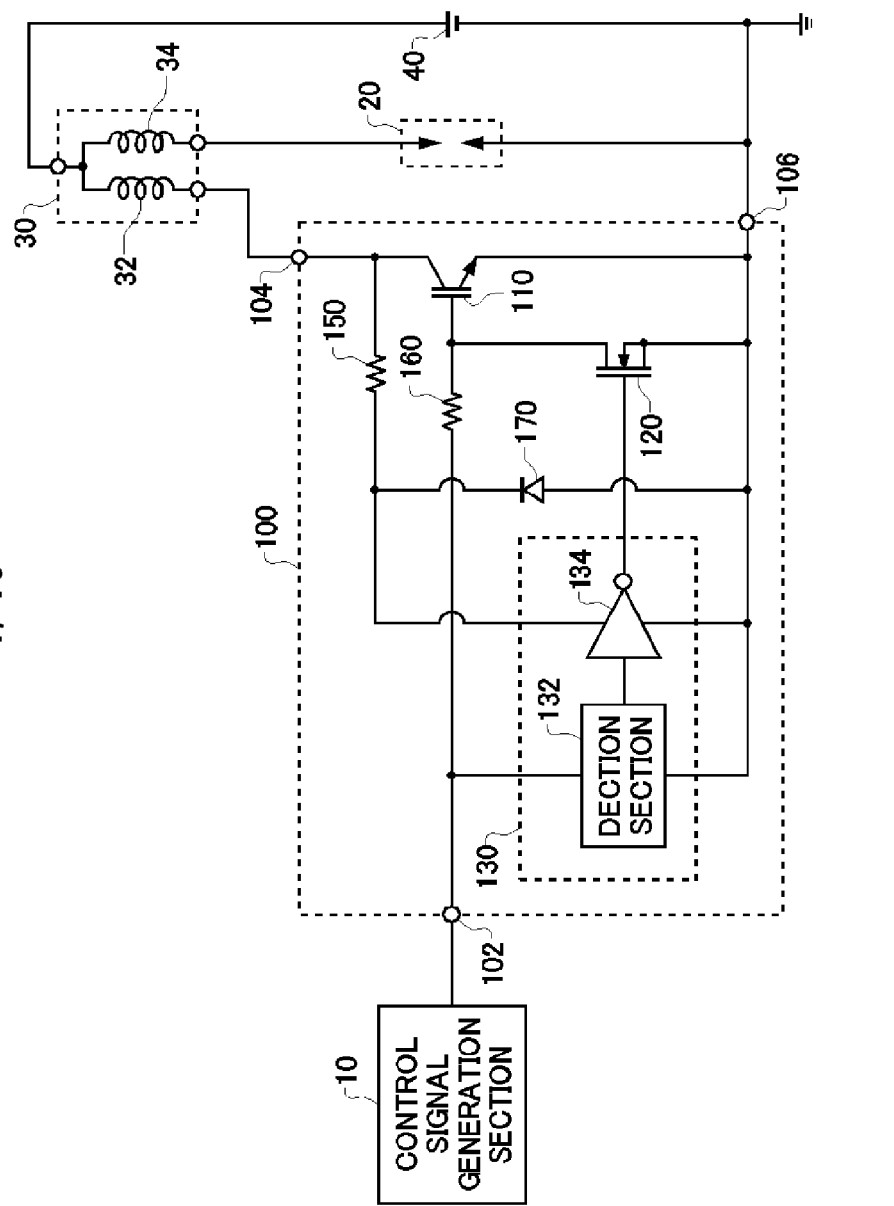
FIG. 1 shows an exemplary configuration of an ignition apparatus 1000 according to the present embodiment.

FIG. 1 shows an exemplary configuration of an ignition apparatus 1000 according to the present embodiment. The ignition apparatus 1000 ignites an ignition plug used for an internal combustion engine and the like of automobiles and the like. In the present embodiment, an example where the ignition apparatus 1000 is equipped in an engine of an automobile will be described. The ignition apparatus 1000 comprises a control signal generation section 10, an ignition plug 20, an ignition coil 30, a power source 40, and a semiconductor apparatus 100.

The control signal generation section 10 generates a switching control signal which controls switching between ON and OFF of the semiconductor apparatus 100. For example, the control signal generation section 10 is a part or the whole of an engine control unit (ECU) of an automobile where the ignition apparatus 1000 is equipped. The control signal generation section 10 supplies the generated control signal to the semiconductor apparatus 100. By supplying to the semiconductor apparatus 100 the control signal by the control signal generation section 10, the ignition apparatus 1000 starts an igniting operation of the ignition plug 20.

The ignition plug 20 electrically generates sparks by discharges. For example, the ignition plug 20 discharges by an applied voltage which is equal to or greater than about 10 kV. As one example, the ignition plug 20 is provided in an internal combustion engine, and in this case, the ignition plug 20 ignites combustible gas such as mixed gas and the like in the combustion chamber. The ignition plug 20 is, for example, provided in a through hole which penetrates from outside the cylinder to the combustion chamber inside the cylinder, and is fixed so as to seal the through hole. In this case, one end of the ignition plug 20 is exposed inside the combustion chamber and the other end receives an electrical signal from the outside of the cylinder.

The ignition coil 30 supplies an electrical signal to the ignition plug 20. The ignition coil 30 supplies a high voltage as the electrical signal to cause the ignition plug 20 to discharge. The ignition coil 30 may function as a transformer and is an ignition coil having a primary coil 32 and a secondary coil 34, for example. One end of the primary coil 32 and one end of the secondary coil 34 are electrically connected. The primary coil 32 has a smaller number of turns of winding than the secondary coil 34 and shares a core with the secondary coil 34. The secondary coil 34 generates an electromotive force (a mutual induced electromotive force) according to an electromotive force generated in the primary coil 32. The secondary coil 34 is connected to the ignition plug 20 on the other end and supplies the generated electromotive force to the ignition plug 20 to cause the ignition plug 20 to discharge.

A power source 40 supplies a voltage to the ignition coil 30. For example, the power source 40 supplies a predetermined constant voltage Vb (as one example, 14V) to one end of the primary coil 32 and one end of the secondary coil 34. The power source 40 is a battery of automobiles as one example.

The semiconductor apparatus 100 switches between conduction (ON) and non-conduction (OFF) between the other end of the primary coil 32 of the ignition coil 30 and a reference potential according to a control signal supplied from the control signal generation section 10. For example, the semiconductor apparatus 100 switches to conduction between the primary coil 32 and the reference potential in response to the control signal being a high potential (an ON potential), and switches to non-conduction between the primary coil 32 and the reference potential in response to the control signal being in a low potential (an OFF potential).

Here, the reference potential may be a reference potential in a control system of an automobile, or may be a reference potential corresponding to the semiconductor apparatus 100 in an automobile. The reference potential may be a low potential to turn the semiconductor apparatus 100 off, and is 0V as one example. The semiconductor apparatus 100 comprises a control terminal 102, a first terminal 104, a second terminal 106, a power semiconductor element 110, a cut-off circuit 120, a cut-off condition detection section 130, a resistance 150, a resistance 160, and a Zener diode 170.

The control terminal 102 inputs a control signal which controls the power semiconductor element 110. The control terminal 102 is connected to the control signal generation section 10 and receives the control signal. The first terminal 104 is connected to the power source 40 via the ignition coil 30. The second terminal 106 is connected to the reference potential. That is, the first terminal 104 is a terminal on a high-potential side compared to the second terminal 106, and the second terminal 106 is a terminal on a low-potential side compared to the first terminal 104.

In the power semiconductor element 110, the gate potential is controlled according to the control signal. The power semiconductor element 110 includes a gate terminal (G), a collector terminal (C), and an emitter terminal (E), and electrically connects or disconnects between the collector terminal and the emitter terminal according to the control signal input into the gate terminal. The power semiconductor element 110 is connected between the first terminal 104 on the high-potential side and the second terminal 106 on the low-potential side and is controlled to be turned on or off according to the gate potential. The power semiconductor element 110 is an insulated gate bipolar transistor (IGBT) as one example. Also, the power semiconductor element 110 may be a MOSFET.

The power semiconductor element 110 has a withstand voltage up to several hundreds of V, as one example. For example, the power semiconductor element 110 is a vertical device in which a collector electrode is formed on a first surface side of a substrate and a gate electrode and an emitter electrode are formed on a second surface side which is opposite to the first surface. Also, the power semiconductor element 110 may be a vertical MOSFET. As one example, the emitter terminal of the power semiconductor element 110 is connected to the reference potential. Also, the collector terminal is connected to the other end of the primary coil 32. In the present exemplary embodiment, an example is described, where the power semiconductor element 110 is an n channel type IGBT which electrically connects between the collector terminal and the emitter terminal in response to the control signal becoming the ON potential.

The cut-off circuit 120 is connected between the gate terminal of the power semiconductor element 110 and the reference potential. As one example, the cut-off circuit 120 is an FET to control ON/OFF states between a drain terminal and a source terminal according to the gate potential. In the cut-off circuit 120, the drain terminal is connected to the gate terminal of the power semiconductor element 110 and the source terminal is connected to the reference potential, and the cut-off circuit 120 switches whether or not to supply the control signal input from the control terminal 102 to the gate terminal of the power semiconductor element 110.

In other words, in the cut-off circuit 120, the drain terminal is connected to the gate terminal of the power semiconductor element 110 and the source terminal is connected to the emitter terminal of the power semiconductor element 110, and the cut-off circuit 120 electrically connects the gate terminal and the emitter terminal of the power semiconductor element 110 to switch whether or not to set the gate of the power semiconductor element 110 to the OFF potential. As one example, the cut-off circuit 120 is a normally-off switch element to electrically connect between the drain terminal and the source terminal in response to the gate terminal becoming the high potential. In this case, it is desirable that the cut-off circuit 120 is an n channel type MOSFET.

The cut-off condition detection section 130 detects whether or not a control signal that is input from the control terminal 102 and controls the power semiconductor element 110 satisfies a predetermined cut-off condition. The cut-off condition detection section 130 may detect whether or not the control signal uses a predetermined threshold and satisfies the cut-off condition. The cut-off condition detection section 130 has a detection section 132 and a signal output section 134.

The detection section 132 detects whether or not the control signal exceeds the predetermined threshold. For example, the detection section 132 determines that the cut-off condition is satisfied in response to a control signal Vin which turns the power semiconductor element 110 on becoming smaller than a threshold Vthin (2V, as one example). The detection section 132 supplies a detection result to the signal output section 134.

The signal output section 134 outputs a cut-off circuit control signal, which controls the cut-off circuit 120, according to the detection result of the detection section 132. The signal output section 134 outputs a cut-off circuit control signal, which turns the cut-off circuit 120 on, according to a detection result showing that the control signal satisfies the cut-off condition. Also, the signal output section 134 outputs a cut-off circuit control signal, which turns the cut-off circuit 120 off, according to a detection result showing that the control signal does not satisfy the cut-off condition.

As one example, the signal output section 134 is an inverter. The signal output section 134 operates using an electrical signal input from the first terminal 104 as a power source, and inverts the detection result of the detection section 132 and outputs the inverted result. The signal output section 134 is connected to the cut-off circuit 120 and supplies the cut-off circuit control signal to the cut-off circuit 120. That is, the cut-off circuit 120 controls the gate potential of the power semiconductor element 110 to be the OFF potential according to the detection where the cut-off condition detection section 130 satisfies the cut-off condition.

The resistance 150 is provided between the first terminal 104 and a power source terminal on the high-potential side of the signal output section 134, and supplies an electrical signal input from the first terminal 104 to the signal output section 134 as the power source. Note that the electrical signal input from the first terminal 104 varies according to the ON/OFF states of the power semiconductor element 110. Here, the resistance 150 limits currents input from the first terminal 104 side to the signal output section 134. For example, the resistance 150 operates as a protection resistance to decrease the currents input from the first terminal 104 side to the signal output section 134 to a value equal to or less than a predetermined current value even if a collector voltage of the power semiconductor element 110 is raised to about 400V.

The resistance 160 is connected between the control terminal 102 and the gate terminal of the power semiconductor element 110. The resistance 160 transmits the control signal to the gate terminal of the power semiconductor element 110 if the cut-off circuit 120 is in the OFF state. The resistance 160 drops the voltage of the control signal if the cut-off circuit 120 causes the control signal to flow to the reference potential in the ON state. That is, the reference potential is to be supplied to the gate terminal of the power semiconductor element 110.

The Zener diode 170 is connected between the resistance 150 and the reference potential. The Zener diode 170 prevents an input of a voltage exceeding a rated voltage of the signal output section 134 from the first terminal 104. For example, the Zener diode 170 clamps the voltage input from the first terminal 104 side to the signal output section 134 to a predetermined voltage value even if the collector voltage of the power semiconductor element 110 is raised to about 400V. As one example, the Zener diode 170 clamps the voltage to a range from about 6V to 16V.

In the semiconductor apparatus 100 according to the present embodiment described above, as the control signal becomes the high potential, the power semiconductor element 110 becomes the ON state. Accordingly, a collector current Ic flows from the power source 40 via the primary coil 32 of the ignition coil 30. Note that a time change $dIc/dt$ of the collector current Ic is determined according to an inductance of the primary coil 32 and a supplied voltage of the power source 40, and increases to a predetermined (or set) current value. For example, the collector current Ic increases to about several amperes, a dozen of amperes, or several dozens of amperes.

Then, as the control signal becomes the low potential, the power semiconductor element 110 becomes the OFF state and the collector current drastically decreases. Due to the drastic decrease of the collector current, a both-end voltage of the primary coil 32 drastically increases by a self-induction electromotive force and an induced electromotive force up to about several dozens of kV is generated on both ends of the secondary coil 34. The ignition apparatus 1000 can cause the ignition plug 20 to discharge to ignite the combustible gas by supplying such a voltage of the secondary coil 34 to the ignition plug 20.

Figure 2:
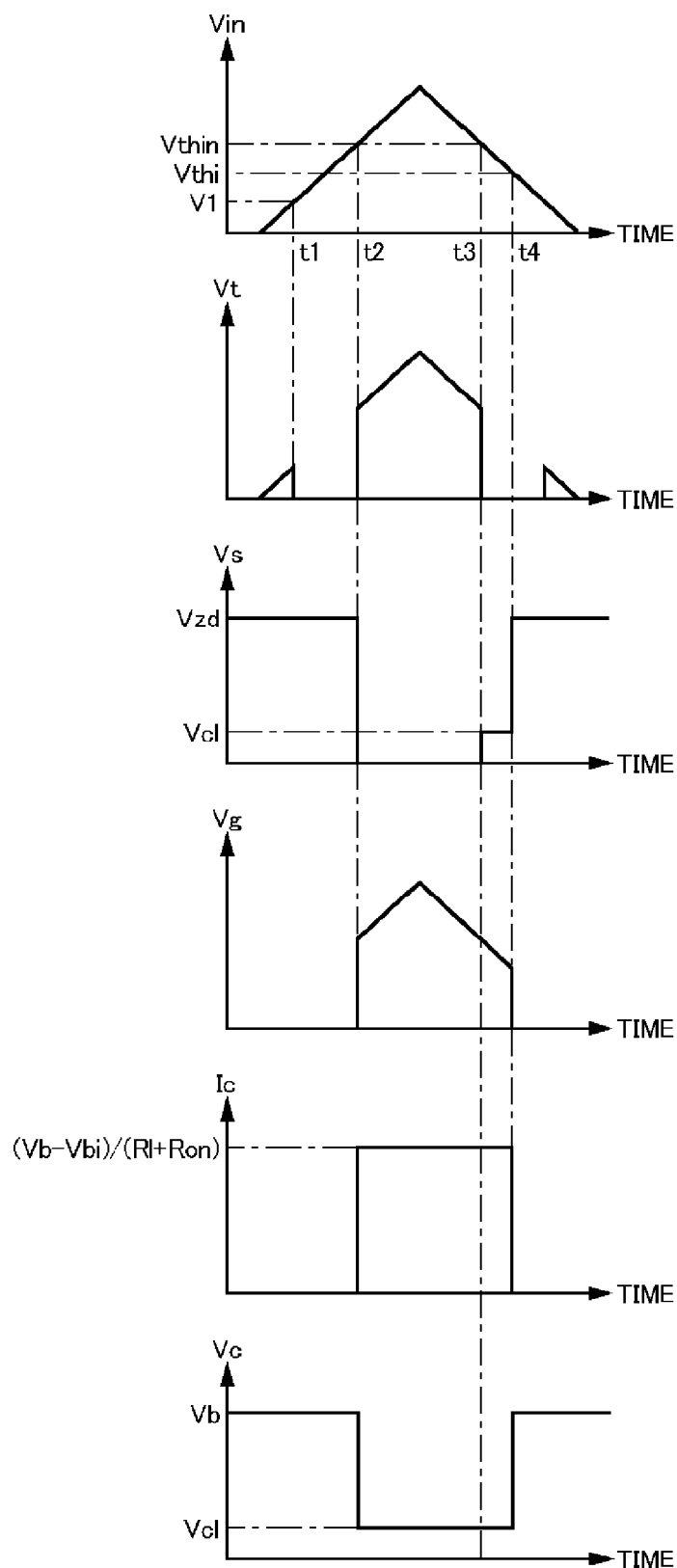
FIG. 2 shows a first example of operation waveforms of each section of a semiconductor apparatus 100 according to the present embodiment.

FIG. 2 shows a first example of operation waveforms of each section of the semiconductor apparatus 100 according to the present embodiment. In FIG. 2, the horizontal axis indicates time and the vertical axis indicates voltage values or current values. Also, FIG. 2 shows respective time waveforms, where "Vin" indicates the control signal input from the control terminal 102, "Vt" indicates the detection signal output by the detection section 132, "Vs" indicates the cut-off circuit control signal output by the signal output section 134, "Vg" indicates the potential of the gate terminal of the power semiconductor element 110, "Ic" indicates the currents (referred to as collector currents) between the collector and the emitter of the power semiconductor element 110, and "Vc" indicates the voltage (referred to as collector voltage) between the collector and the emitter of the power semiconductor element 110.

FIG. 2 shows an example of a triangular wave shape, where the control signal Vin input to the control terminal 102 linearly rises from 0V to a voltage beyond the threshold Vthin of the detection section 132, and after that, the control signal Vin linearly falls down from the voltage beyond the threshold Vthin to 0V. Also, FIG. 2 shows the operation waveforms of each section with respect to the control signal Vin of the triangular wave shape.

The detection section 132 may use the control signal input from the control terminal 102 as an operation voltage. In this case, the detection section 132 executes a detection operation in response to the control signal beyond a threshold V1 being input. Therefore, the detection section 132 becomes to output the input signal as it is if the control signal does not exceed the threshold V1. That is, the detection section 132 outputs a potential approximately the same as the control signal Vin until the control signal Vin exceeds the threshold V1. FIG. 2 shows an example where a detection signal Vt of the detection section 132 becomes an output waveform approximately the same as that of the control signal Vin until a time t1 and after a time t4 is passed.

Also, in a case where Vin exceeds the threshold V1 and is a potential equal to or less than the threshold Vthin, the detection section 132 determines that the cut-off condition is satisfied and outputs the low potential. FIG. 2 shows an example where the detection signal Vt of the detection section 132 becomes the low potential during a period from the time t1 to a time t2 and during a period from a time t3 to a time t4. Also, in a case where Vin exceeds the threshold Vthin, the detection section 132 determines that the cut-off condition is not satisfied and outputs the high potential. Note that the detection section 132 may output a potential approximately the same as the control signal Vin as the high potential. FIG. 2 shows an example where the detection signal Vt of the detection section 132 becomes to have an output waveform approximately the same as that of the control signal Vin during a period from the time t2 to the time t3.

Since the signal output section 134 operates using the electrical signal input from the first terminal 104 as the power source, when outputting the high potential, the signal output section 134 outputs the potential of the smaller one of the collector voltage Vc and a breakdown voltage Vzd of the Zener diode 170. For example, if the detection signal Vt is the low potential, the signal output section 134 outputs such a high potential as the inverted signal of the low potential. FIG. 2 shows an example where the cut-off circuit control signal Vs of the signal output section 134 outputs the potential approximately the same as the breakdown voltage Vzd until the time t2.

Also, the signal output section 134 outputs the low potential being the inverted signal of the high potential in response to the detection signal Vt becoming the high potential. FIG. 2 shows an example where the cut-off circuit control signal Vs of the signal output section 134 becomes the low potential during the period from the time t2 to the time t3.

Note that during the period from the time t3 to the time t4, since the detection signal Vt becomes the low potential, the signal output section 134 outputs the high potential again. However, since the control signal Vin is within a range of potentials larger than a threshold Vthi of the power semiconductor element 110, the power semiconductor element 110 is kept in the ON state and the collector voltage Vc becomes a potential Vcl when the power semiconductor element 110 is turned on. Since the potential Vcl becomes the potential smaller than the breakdown voltage Vzd of the Zener diode 170, as shown in the example of FIG. 2, the cut-off circuit control signal Vs of the signal output section 134 becomes to output the potential approximately the same as the potential Vcl when the collector terminal is turned on during the period from the time t3 to the time t4.

Also, the detection signal Vt becomes the low potential as the time is beyond the time t4, and since the control signal Vin is within a range of potentials smaller than the threshold Vthi of the power semiconductor element 110, the power semiconductor element 110 is switched to the OFF state and the collector voltage Vc becomes approximately the same as the constant voltage Vb supplied by the power source 40. Therefore, as shown in the example of FIG. 2, the cut-off circuit control signal Vs of the signal output section 134 becomes the high potential approximately the same as the breakdown voltage Vzd if the time is beyond the time t4.

The potential Vg of the gate terminal of the power semiconductor element 110 becomes the low potential if the cut-off circuit control signal Vs is the high potential exceeding the threshold of the cut-off circuit 120. Also, the potential Vg becomes the potential approximately the same as the control signal Vin if the cut-off circuit control signal Vs is the low potential equal to or less than the threshold of the cut-off circuit 120. FIG. 2 shows an example where Vg becomes the low potential until the time t2 and when the time is beyond the time t4, and becomes the potential approximately the same as the control signal Vin during a period from the time t2 to the time t4.

The power semiconductor element 110 operates according to such a potential Vg of the gate terminal. That is, in the example of FIG. 2, the power semiconductor element 110 becomes the ON state during the period from the time t2 to the time t4, and becomes the OFF state during the period until the time t2 and the period beyond the time t4.

That is, the collector current Ic of the power semiconductor element 110 becomes approximate 0 (turned off) until Vg exceeds Vthin, and flows (turned on) in response to Vg being in the potential beyond Vthin, the maximum value of the potential being (Vb−Vbi)/(R1+Ron). Here, Vb indicates a constant voltage supplied by the power source 40, Vbi indicates a built-in potential of the power semiconductor element 110, R1 indicates a resistance of the primary coil 32, and Ron indicates an ON resistance of the power semiconductor element 110. FIG. 2 shows an example where the collector current Ic becomes OFF during the period until the time t2 and during the period beyond the time t4, and becomes (Vb−Vbi)/(R1+Ron) during the period from the time t2 to the time t4.

The collector voltage Vc of the power semiconductor element 110 becomes the high potential until Vg exceeds Vthin and becomes the low potential in response to Vg being the potential beyond Vthin. FIG. 2 shows an example where Vc becomes the low potential at the time t2 and becomes the high potential at the time t4.

Here, in the semiconductor apparatus 100 shown in FIG. 1, the collector voltage Vc becomes approximately the same as the constant voltage Vb supplied by the power source 40 in the state where the power semiconductor element 110 is turned off. In this case, the signal output section 134 outputs the potential approximately the same as Vb, an upper limit of the potential being set to the breakdown voltage of the Zener diode 170. Note that in a case where Vb is larger than the threshold (1.1 V, as one example) of the cut-off circuit 120, the cut-off circuit 120 cuts off the power semiconductor element 110. In the present exemplary embodiment, since the constant voltage Vb is 14V as one example, the collector voltage Vc becomes the potential approximately the same as the constant voltage Vb during the period until the time t2 and during the period beyond the time t4.

Also, in the state where the power semiconductor element 110 is turned on, the collector voltage Vc is determined according to Vb, the built-in potential Vbi of the power semiconductor element 110, the ON resistance Ron of the power semiconductor element 110, and the resistance R1 of the primary coil 32, expressed as the following equation: Vc=(Vb−Vbi)×Ron/(Ron+R1)+Vbi. For example, in a case where Vbi=0.6V, Ron=50 mΩ, and R1=0.6Ω, if Vb=14V, Vc=1.63V, and if Vb=6V, Vc=1.02V.

That is, when the detection section 132 detects the cut-off condition in the state where the power semiconductor element 110 is turned on, if Vb=14V, the cut-off circuit 120 cuts off the power semiconductor element 110, but if Vb=6V, the cut-off circuit 120 cannot cut off the power semiconductor element 110. In the present exemplary embodiment, since the constant voltage Vb is 14V as one example, the collector voltage Vc becomes the potential approximately the same as Vcl=1.63V during the period from the time t2 to the time t4.

As described above, it can been known that in the semiconductor apparatus 100, during the period from the time t3 to the time t4, the power semiconductor element 110 may remain in the ON state even if the control signal Vin satisfies the cut-off condition in some cases. As such a malfunction occurs and the operation is continued in a state where the malfunction remains, failures of the power semiconductor element 110 and the like may occur in some cases. Also, not only the failures of the power semiconductor element 110 and the like, but also defects and the like of the internal combustion engine and the like connected to the power semiconductor element 110 may occur in some cases.

Note that as the threshold Vthi becomes further smaller, the power semiconductor element 110 also reduces loss and becomes advantageous as a switch; therefore, it is opposite to the occurrence of the malfunction. Here, the semiconductor apparatus 200 according to the present embodiment surely cuts off the power semiconductor element 110 to prevent the malfunction in response to the control signal Vin satisfying the cut-off condition even if the power semiconductor element 110 is turned on, without depending on the value of the threshold Vthi.

Figure 3:
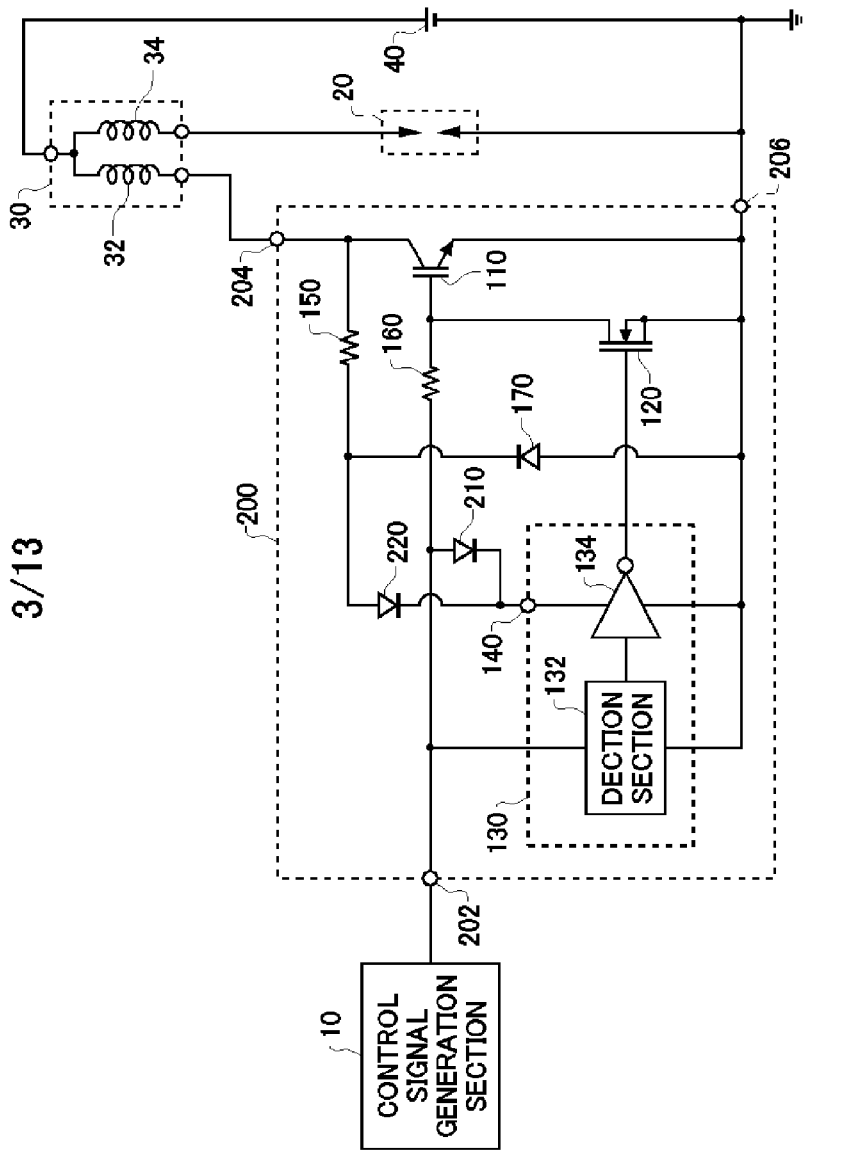
FIG. 3 shows an exemplary configuration of an ignition apparatus 2000 according to the present embodiment.

FIG. 3 shows an exemplary configuration of the ignition apparatus 2000 according to the present embodiment. In the ignition apparatus 2000 shown in FIG. 3, operations approximately the same as those of the ignition apparatus 2000 according to the present embodiment shown in FIG. 1 are given with the same reference signs, and the descriptions for them are omitted. The ignition apparatus 2000 comprises a semiconductor apparatus 200. The descriptions for the control signal generation section 10, the ignition plug 20, the ignition coil 30, and the power source 40 comprised in the ignition apparatus 2000 are omitted.

The semiconductor apparatus 200 comprises a control terminal 202, a first terminal 204, a second terminal 206, the power semiconductor element 110, the cut-off circuit 120, the cut-off condition detection section 130, the resistance 150, the resistance 160, the Zener diode 170, a first rectifying element 210, and a second rectifying element 220.

The control terminal 202 inputs a control signal which controls the power semiconductor element 110. The control terminal 202 is connected to the control signal generation section 10 and receives the control signal. The first terminal 204 is connected to the power source 40 via the ignition coil 30. The second terminal 206 is connected to the reference potential. That is, the first terminal 204 is a terminal on the high-potential side compared to the second terminal 206, and the second terminal 206 is a terminal on the low-potential side compared to the first terminal 204.

Since the power semiconductor element 110, the cut-off circuit 120, the resistance 150, the resistance 160, and the Zener diode 170 have been described in FIG. 1, the descriptions for them are omitted here.

The cut-off condition detection section 130 has an input terminal 140 connected to the first terminal 204 and the control terminal 202 and uses an electrical signal input from the input terminal 140 as the power source. That is, the cut-off condition detection section 130 uses two-system signals, which are the electrical signal from the first terminal 204 and the control signal from the control terminal 202, as the power source. Accordingly, the signal output section 134 can compensate the voltage with the signal voltage of the electrical signal from the control terminal 202 when the signal voltage of the electrical signal from the first terminal 204 is lowered, being able to receive a stable power source voltage from the input terminal 140.

The first rectifying element 210 is connected between the control terminal 202 and the input terminal 140 of the cut-off condition detection section 130. The first rectifying element 210 suppresses the electrical signal flowing reversely to the control terminal 202 while supplying the control signal input from the control terminal 202 to the signal output section 134. Accordingly, the signal output section 134 receives the power supply from the control terminal 202 via the first rectifying element 210, the control terminal 202 inputting the control signal which controls the power semiconductor element 110. For example, in a case where the high potential about 5V as the control signal is input from the control terminal 202, the first rectifying element 210 supplies the potential about 4.4V to the signal output section 134. Here, a threshold Vf of the first rectifying element 210 is set to about 0.6V. As one example, the first rectifying element 210 is a diode.

The second rectifying element 220 is connected between the first terminal 204 and the input terminal 140 of the cut-off condition detection section 130. The second rectifying element 220 may be connected between the resistance 150 and the signal output section 134, and suppresses the electrical signal flowing reversely to the first terminal 204 while supplying the potential of the first terminal 204 to the signal output section 134 via the resistance 150. Accordingly, the signal output section 134 receives the power supply from the first terminal 204 via the second rectifying element 220.

For example, in a case where the breakdown voltage Vzd of the Zener diode 170 is about 6V, the second rectifying element 220 supplies the potential of about 5.4V to the signal output section 134 under a condition where the collector voltage Vc is equal to or greater than 6V. Here, the threshold Vf of the second rectifying element 220 is set to about 0.6V. As one example, the second rectifying element 220 is a diode.

In this case, the resistance 150 is connected between the first terminal 204 and the second rectifying element 220. It is sufficient if the resistance 150 is an element having a resistance limiting currents input from the first terminal 104 side to the signal output section 134 via the input terminal 140, and the resistance 150 is not limited to a resistor element.

Similar to the semiconductor apparatus 100 described in FIG. 1, in the semiconductor apparatus 200 according to the present embodiment described above, the power semiconductor element 110 becomes the ON state if the control signal becomes the high potential. Accordingly, as described in FIG. 1, the ignition apparatus 2000 can cause the ignition plug 20 to discharge to ignite the combustible gas.

Also, in case where the control signal changes from the high potential to the low potential, the signal output section 134 outputs the potential of about 4.4V first and then starts to cut off the power semiconductor element 110. After the cutting off starts, as Vc>Vin, the output potential of the signal output section 134 becomes Vc−Vf and continues cutting off the power semiconductor element 110. That is, since either the control terminal 202 or the collector voltage is equal to or greater than the high potential, the signal output section 134 can prevent the malfunction of the power semiconductor element 110 without any shortage of the power source voltage. Details for each section of such an ignition apparatus 2000 will be described in the followings.

Figure 4:
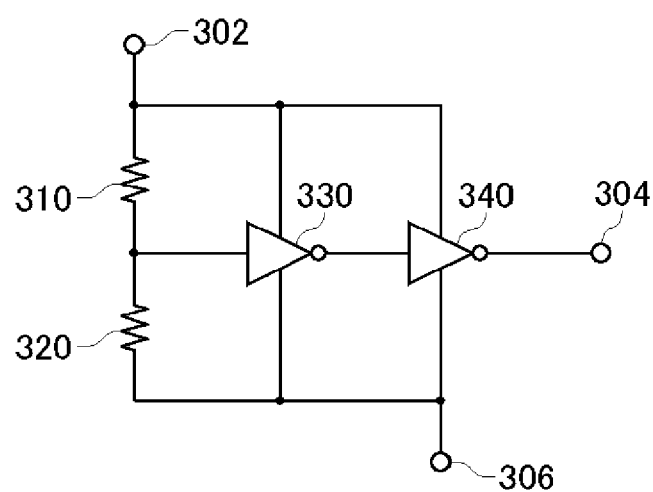
FIG. 4 shows an exemplary configuration of a detection section 132 according to the present embodiment.

FIG. 4 shows an exemplary configuration of a detection section 132 according to the present embodiment. The detection section 132 includes a control signal input section 302, a detection signal output section 304, a reference potential input section 306, a resistance 310, a resistance 320, an inverter 330, and an inverter 340.

The control signal input section 302 inputs the control signal input from the control terminal 202. The detection section 132 operates using the control signal as the power source. The detection signal output section 304 outputs the detection result of the detection section 132. As one example, the detection signal output section 304 is connected to the signal output section 134 and outputs the same logic potential as the control signal as the detection result of the control signal. The reference potential input section 306 is connected to the reference potential.

The resistance 310 and the resistance 320 are connected in series between the control signal input section 302 and the reference potential input section 306, and divide the voltage of the control signal Vin input from the control signal input section 302. Here, the voltage-divided potential divided and output by the resistance 310 and the resistance 320 is the potential between the resistance 310 and the resistance 320. For example, the voltage-divided potential becomes:

Vin·R2/(R1+R2), where R1 indicates the resistance value of the resistance 310 and R2 indicates the resistance value of the resistance 320. As one example, if the control signal transiently rises linearly from the OFF potential (0V, as one example) to the ON potential (5V, as one example), the voltage-divided potential also rises linearly from 0V to 5·R2/(R1+R2).

The inverter 330 having an input terminal connected between the resistance 310 and the resistance 320 receives the voltage-divided potential and outputs, from an output terminal, a signal where the logic is inverted. The inverter 340 receives the output signal of the inverter 330 and outputs a signal where the logic is inverted.

Note that the inverter 330 and the inverter 340 respectively take the control signal input from the control signal input section 302 as the operation power source. Therefore, in a process where the control signal rises transiently, each inverter outputs the signal of approximately the same potential as the control signal until the control signal reaches the thresholds of the inverters. Note that in the present example, the thresholds of each inverter are set to approximately the same value V1. Operations in each section of such a detection section 132 are described using FIG. 5.

Figure 5:
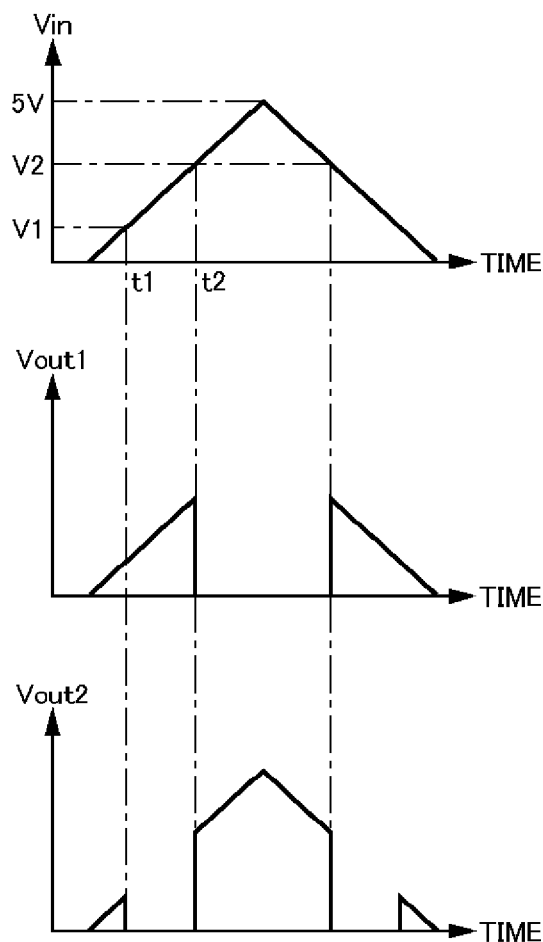
FIG. 5 shows one example of operation waveforms of each section of the detection section 132 according to the present embodiment.

FIG. 5 shows one example of operation waveforms of each section of the detection section 132 according to the present embodiment. In FIG. 5, the horizontal axis indicates time and the vertical axis indicates output potentials. FIG. 5 shows one example of the output potentials of the inverter 330 and the inverter 340 with respect to a case where the control signal Vin input to the control signal input section 302 linearly rises from the OFF potential (0V) to the ON potential (5V). An output potential Vout1 of the inverter 330 and an output potential Vout2 of the inverter 340 are approximately the same potential as the power source potential (i.e., the control signal Vin) until the input potential reaches the threshold V1 of the inverters.

In the inverter 330, since the input voltage-divided potential Vin·R2/(R1+R2) is a value equal to or less than the threshold V1 even if the potential of the power source exceeds the threshold V1, the input potential becomes the low potential and the inverted output becomes the high potential. Note that even though the inverter 330 operates so as to output the high potential, if the power source potential is a transient potential in the process until reaching the high potential (for example, 5V), the inverter 330 outputs the power source potential as the high potential. FIG. 5 shows an example where the output potential Vout1 of the inverter 330 outputs approximately the same potential as the power source potential Vin on and after the time t1.

The inverter 330 inverts the low potential and outputs the inverted potential in response to the potential of the power source exceeding the threshold V1 and the input voltage-divided potential exceeding the threshold V1 (i.e., the input of the high potential). FIG. 5 shows an example where the output potential Vout1 of the inverter 330 becomes the low potential (0V) at the time t2.

The inverter 340 inverts the low potential and outputs the inverted potential in response to the potential of the power source being the potential exceeding the threshold V1 and the input potential being the potential exceeding the threshold V1. FIG. 5 shows an example where the output potential Vout2 of the inverter 340 becomes the low potential at the time t1. The inverter 340 inverts the high potential and outputs the inverted potential in response to the potential of the power source being the potential exceeding the threshold V1 and the input potential being the low potential. Note that the inverter 340 outputs the power source potential as the high potential in a case where the power source potential is the transient potential in the process until reaching the high potential. FIG. 5 shows an example where the output potential Vout2 of the inverter 340 becomes the potential approximately the same as the power source potential Vin after the time t2 is passed.

The detection section 132 outputs such an output potential Vout2 of the inverter 340 from the detection signal output section 304 as the detection signal. Then, the signal output section 134 uses the electrical signal input from the first terminal 204 and the control terminal 202 as the power source and controls the cut-off circuit 120 according to the detection signal. Accordingly, the semiconductor apparatus 200 according to the present embodiment operates as an igniter to control the currents flowing through the ignition coil 30 according to the control signal from outside. Operations of the semiconductor apparatus 200 are described using FIG. 6.

Figure 6:
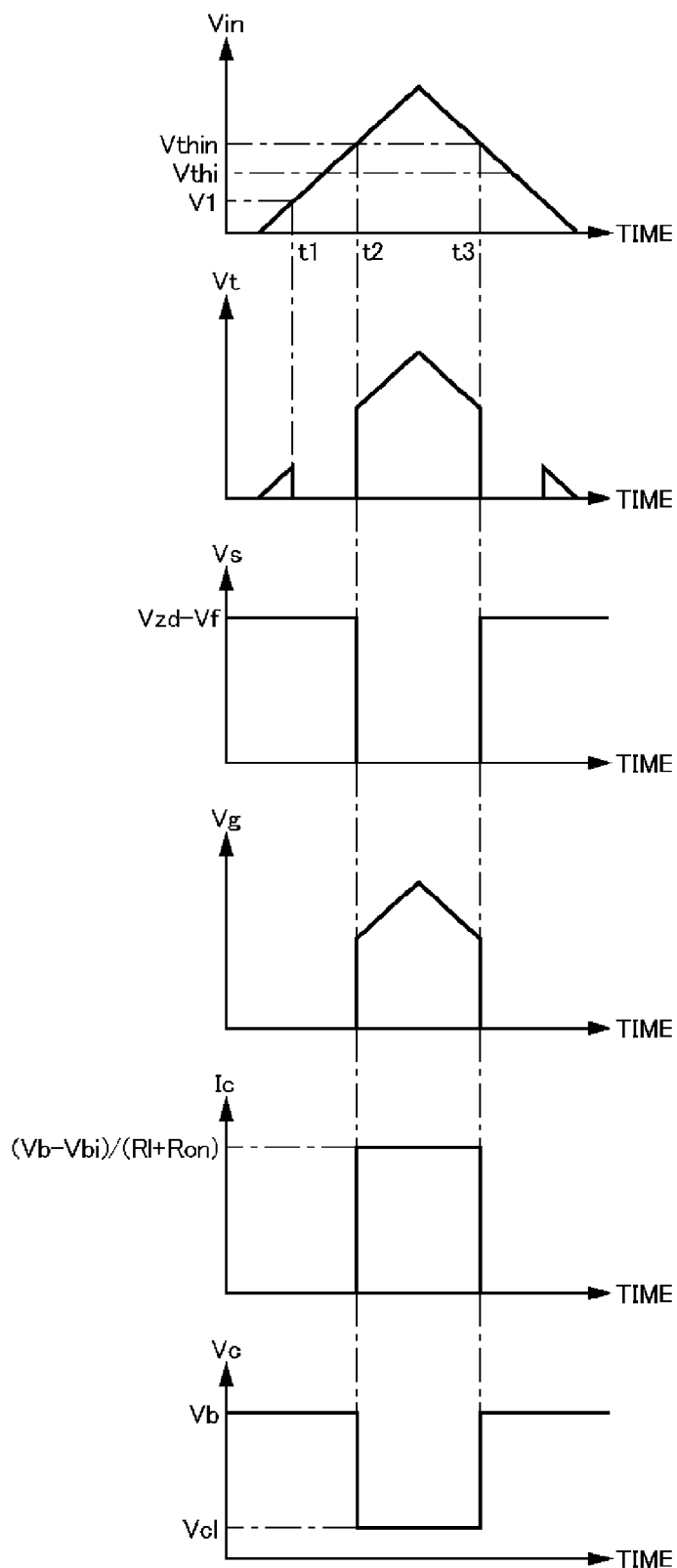
FIG. 6 shows examples of operation waveforms of each section of a semiconductor apparatus 200 according to the present embodiment.

FIG. 6 shows examples of operation waveforms of each section of the semiconductor apparatus 200 according to the present embodiment. In FIG. 6, the horizontal axis indicates time and the vertical axis indicates voltage values or current values. Also, FIG. 6 shows respective time waveforms, where "Vin" indicates the control signal input from the control terminal 202, "Vt" indicates the detection signal output by the detection section 132, "Vs" indicates the cut-off circuit control signal output by the signal output section 134, "Vg" indicates the potential of the gate terminal of the power semiconductor element 110, "Ic" indicates the currents (referred to as collector currents) between the collector and the emitter of the power semiconductor element 110, and "Vc" indicates the voltage (referred to as collector voltage) between the collector and the emitter of the power semiconductor element 110.

The time waveform of the detection signal Vt of the detection section 132 is approximately the same as that of the output potential Vout2 of the inverter 340 described in FIG. 5. Also, since the time waveform of the detection signal Vt of the detection section 132 is also approximately the same as that of Vt of the detection section 132 of the semiconductor apparatus 100 shown in FIG. 2, the description for it is omitted here.

Since the signal output section 134 inverts the detection signal Vt and outputs the inverted signal, the signal output section 134 operates so as to output the high potential until the time t2. In this case, as described in FIG. 2, the potential input from the first terminal 204 to the input terminal 140 becomes a potential which is obtained by subtracting the threshold Vf of the second rectifying element 220 from a potential of the smaller one of the collector voltage Vc of the power semiconductor element 110 and the breakdown voltage Vzd of the Zener diode 170. That is, because the power semiconductor element 110 is in the OFF state, the potential becomes Vzd−Vf until the time t2. Therefore, since the potential Vzd−Vf is input as the power source voltage, similar to FIG. 2, the signal output section 134 outputs the cut-off circuit control signal Vs approximately the same as the potential Vzd−Vf.

Also, as the time t2 is passed, the signal output section 134 outputs the low potential as the inverted output of the detection signal Vt. Also, as the time t3 is passed, the signal output section 134 operates so as to output the high potential as the inverted output of the detection signal Vt. In this case, during a period since the time t3 is passed until the potential of the control signal Vin becomes equal to or less than Vthi, as described in FIG. 2, the potential input from the first terminal 204 to the input terminal 140 becomes the potential approximately the same as the potential Vcl when the collector terminal is turned on. On the other hand, the potential of the control signal Vin input from the control terminal 202 to the input terminal 140 is the potential which is beyond Vthi.

Therefore, since the signal output section 134 of the present embodiment uses the control signal Vin as the power source, the signal output section 134 can output the cut-off circuit control signal Vs being the high potential of the inverted output in response to the detection signal Vt becoming the low potential at the time t3. Accordingly, since the cut-off circuit 120 sets the gate of the power semiconductor element 110 to the OFF potential, the power semiconductor element 110 becomes the OFF state and the collector voltage becomes Vb. That is, since the potential input from the first terminal 204 to the input terminal 140 becomes Vzd−Vf, the signal output section 134 can output the cut-off circuit control signal Vs approximately the same as the potential Vzd−Vf since the time t3.

As described above, as shown in the example of FIG. 6, the cut-off circuit control signal Vs output by the signal output section 134 becomes the high potential until the time t2 and after the time t3 is passed, and becomes the low potential during the period from the time t2 to the time t3. Since the cut-off circuit 120 controls the gate potential Vg of the power semiconductor element 110 according to such a cut-off circuit control signal Vs, as shown in the example of FIG. 6, the gate potential Vg becomes approximately the same potential as the control signal Vin during the period from the time t2 to the time t3 and becomes the low potential until the time t2 and after the time t3 is passed.

Therefore, the power semiconductor element 110 becomes the ON state during the period from the time t2 to the time t3, and becomes the OFF state until the time t2 and after the time t3 is passed. Accordingly, as shown in the example of FIG. 6, the collector current Ic is off until the time t2 and is on in response to Vg being in the potential beyond Vthin, the maximum value of the potential being (Vb−Vbi)/(R1+Ron).

Also, the collector voltage Vc of the power semiconductor element 110 becomes the high potential until the time t2 and after the time t3 is passed, and becomes the low potential during the period from the time t2 to the time t3. FIG. 6 shows an example where the collector voltage Vc becomes the low potential (Vcl) during the period from the time t2 to the time t3, and becomes the high potential (Vb) during until the time t2 and after the time t3 is passed.

The semiconductor apparatus 200 according to the present embodiment described above can cut off the power semiconductor element 110 by using the two-system power sources even if the control signal Vin is switched from on to off. Therefore, the semiconductor apparatus 200 can surely cut off the power semiconductor device and can prevent the malfunction according to the cut-off signal.

Figure 7:
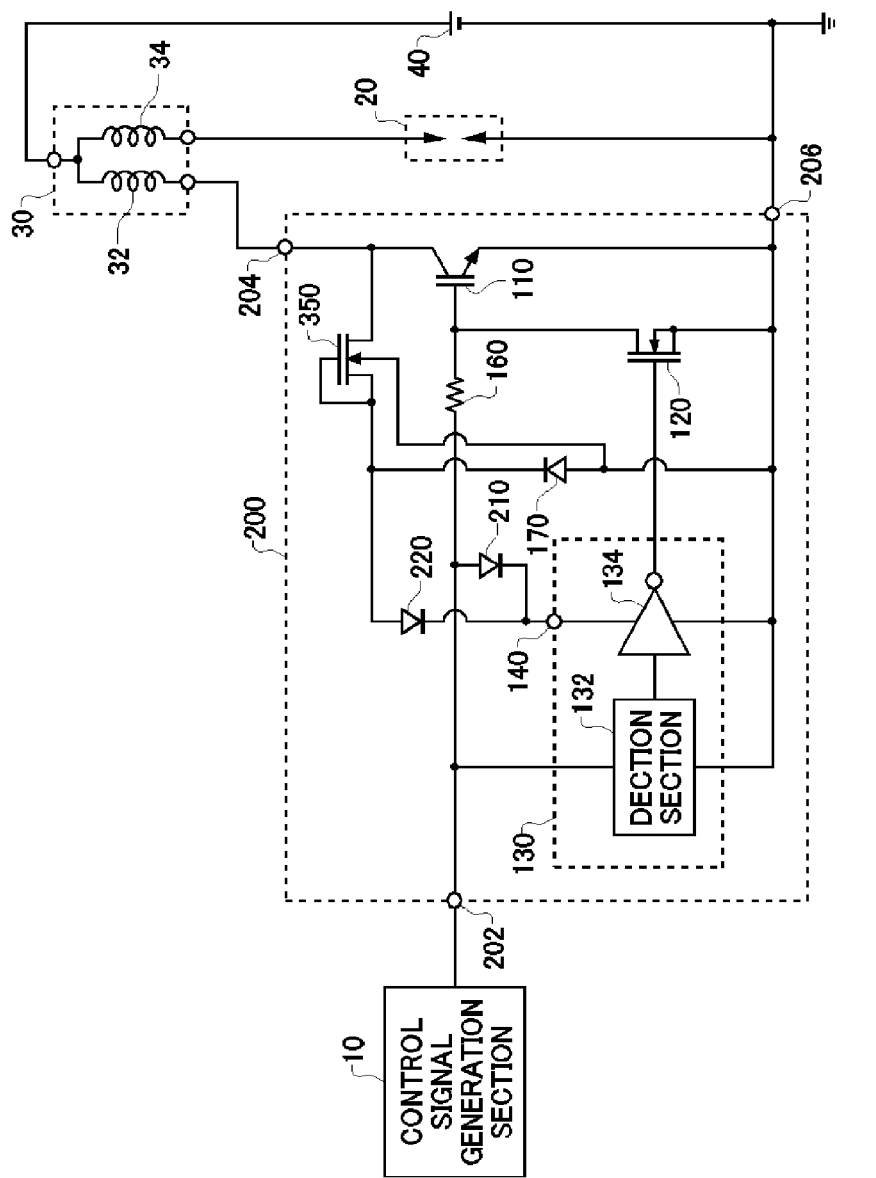
FIG. 7 shows a first modification example of the ignition apparatus 2000 according to the present embodiment.

The example where the resistance 150 is connected between the first terminal 204 and the second rectifying element 220 in the semiconductor apparatus 200 according to the present embodiment described above has been described. Instead of this, for example, a switch element may be connected between the first terminal 204 and the second rectifying element 220. FIG. 7 shows a first modification example of the ignition apparatus 2000 according to the present embodiment. In the ignition apparatus 2000 of the present modification example, operations approximately the same as those of the ignition apparatus 2000 according to the present embodiment shown in FIG. 3 are given with the same reference signs, and the descriptions for them are omitted.

An example is shown, where a switch element 350 is connected between the first terminal 204 and the second rectifying element 220 in the ignition apparatus 2000 of the present modification example. As one example, the switch element 350 may be a depression type MOSFET, and in this case, a drain, a source, and a gate may be respectively connected to the first terminal 204, the second rectifying element 220, and the source. Accordingly, even if the collector voltage Vc is excessive, the switch element 350 can increase the resistance value between the drain and the source corresponding to the collector voltage Vc. That is, the switch element 350 can limit the current flowing through the second rectifying element 220 to about 100 μA as one example, and can prevent the excessive current from flowing along with the increase of the collector voltage Vc.

As described above, although it has been described that the semiconductor apparatus 200 according to the present embodiment can cut off the power semiconductor element 110, in addition to this, the semiconductor apparatus 200 may further shorten the transient cut-off time. In order to describe such a semiconductor apparatus 200, a transient response of the semiconductor apparatus 100 according to the present embodiment shown in FIG. 1 will be described first.

Figure 8:
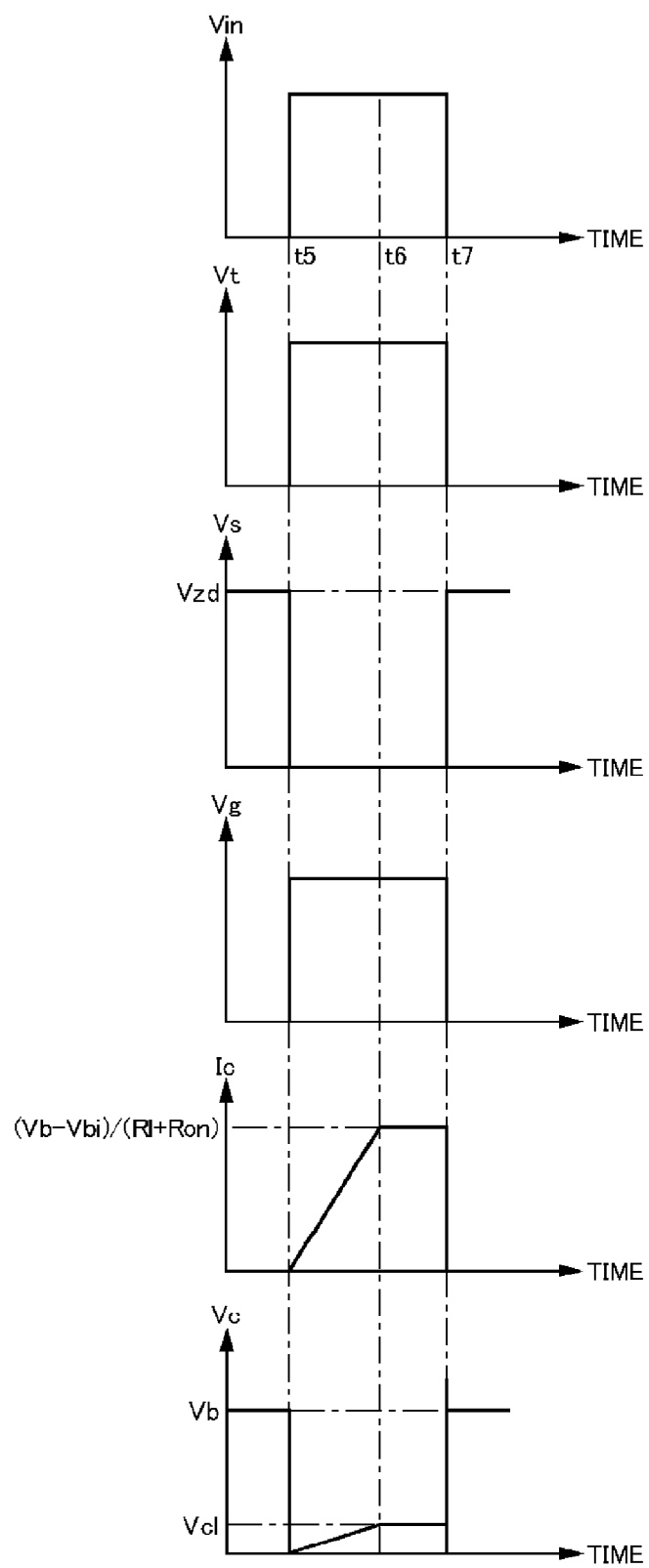
FIG. 8 shows a second example of the operation waveforms of each section of the semiconductor apparatus 100 according to the present embodiment.

FIG. 8 shows a second example of the operation waveforms of each section of the semiconductor apparatus 100 according to the present embodiment. In FIG. 8, the horizontal axis indicates time, and the vertical axis indicates voltage values or current values. Also, FIG. 8 shows respective time waveforms, where "Vin" indicates the control signal input from the control terminal 102, "Vt" indicates the detection signal output by the detection section 132, "Vs" indicates the cut-off circuit control signal output by the signal output section 134, "Vg" indicates the potential of the gate terminal of the power semiconductor element 110, "Ic" indicates the collector current of the power semiconductor element 110, and "Vc" indicates the collector voltage of the power semiconductor element 110.

FIG. 8 shows an example of a rectangular wave shape, where the control signal Vin becomes on at a time t5 and becomes off at a time t7. Note that an amplitude value of the rectangular wave is set to the voltage beyond the threshold Vthin of the detection section 132. Accordingly, the detection signal Vt output by the detection section 132 also becomes the rectangular wave shape where the detection signal Vt becomes the high potential at the time t5 and becomes the low potential at the time t7.

According to such a detection signal Vt of the detection section 132, the cut-off circuit control signal Vs becomes the high potential until the time t5, becomes the low potential during a period from the time t5 to the time t7, and becomes the high potential since the time t7. Therefore, the gate potential Vg of the power semiconductor element 110 becomes the rectangular wave shape where the gate potential Vg becomes the high potential at the time t5 and becomes the low potential at the time t7. Accordingly, the collector current Ic starts to flow at the time t5 and the collector current Ic saturates at a time t6, as one example. Similar to such a collector current Ic, the collector voltage Vc starts to increase since the time t5 and reaches the potential Vcl when the power semiconductor element 110 is turned on at the time t6.

Then, at the time t7, since the gate potential Vg becomes the low potential and the power semiconductor element 110 is switched to OFF, the collector current Ic is cut off and the collector voltage Vc becomes equal to the voltage Vb of the power source 40 after drastically increasing. Such a transient operation of the semiconductor apparatus 100 will be described in the followings.

Figure 9:
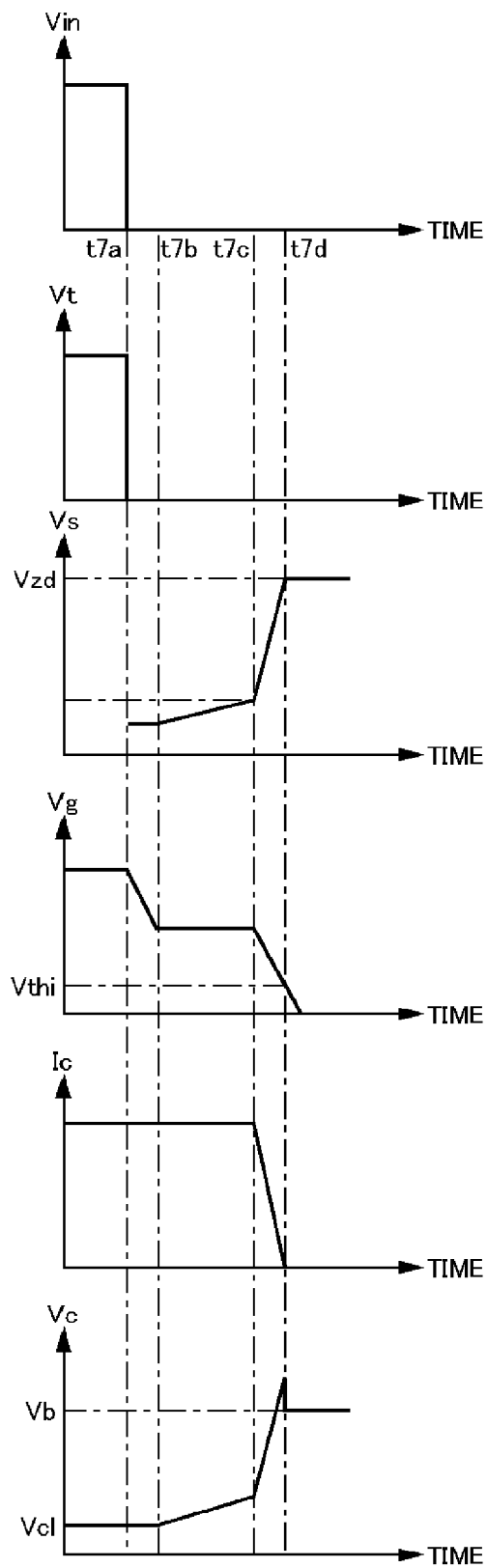
FIG. 9 shows one example of enlarged waveforms of the second example of the operation waveforms shown in FIG. 8.

FIG. 9 shows one example of an enlarged waveform of the second example of the operation waveform shown in FIG. 8. FIG. 9 shows an example where a period of time before and after the control signal Vin is switched to OFF in FIG. 8 is magnified by about 100 times. In FIG. 9, a time when the control signal Vin becomes OFF is set as a time t7a anew. The detection signal Vt output by the detection section 132 becomes the low potential at the time t7a according to the control signal Vin.

Transiently, as the control signal Vin becomes OFF, the gate potential Vg of the power semiconductor element 110 is gradually lowered as shown in a period from the time t7a to a time t7b. Since the decreased amount of the gate potential Vg is slight, the cut-off circuit control signal Vs, the collector current Ic, and the collector voltage Vc almost have no change and maintain the values at the time t7a during the period from the time t7a to the time t7b.

As the gate potential Vg of the power semiconductor element 110 is lowered, the power semiconductor element 110 is finally pinched off. In this case, the collector voltage Vc starts to increase, the mirror current flows from the collector to the gate, and the decrease of the gate potential Vg is stopped. In FIG. 9, a period when the gate potential Vg is maintained in an approximately constant voltage is set as a period from the time t7b to a time t7c. During the period from the time t7b to the time t7c, the cut-off circuit control signal Vs starts to increase along with the increase of the collector voltage Vc. Also, the collector current Ic almost has no change and is maintained in the value at the time t7a.

Then, as the collector voltage Vc of the power semiconductor element 110 increases and reaches a fixed value, an expansion of a depletion layer between the gate and the collector is stopped and the mirror current is also stopped. Accordingly, the gate potential Vg of the power semiconductor element 110 is lowered until reaching 0V. In FIG. 9, a period when the gate potential Vg is lowered to the threshold Vthi is set as a period from the time t7c to a time t7d. Along with such a decrease of the gate potential Vg, the cut-off circuit control signal Vs and the collector voltage Vc increase and the collector current Ic decreases.

As the gate potential Vg of the power semiconductor element 110 becomes 0V, the cut-off circuit control signal Vs, the collector current Ic, and the collector voltage Vc, after drastically increasing, respectively becomes equal to the voltage Vzd, 0A, and the voltage Vb. As described above, in the semiconductor apparatus 100, transiently, the gate potential Vg becomes smaller than the threshold Vthi since the cut-off time from the time t7a when the control signal Vin becomes OFF to the time t7d elapses. Here, the semiconductor apparatus 200 according to the present embodiment shortens such a cut-off time.

Figure 10:
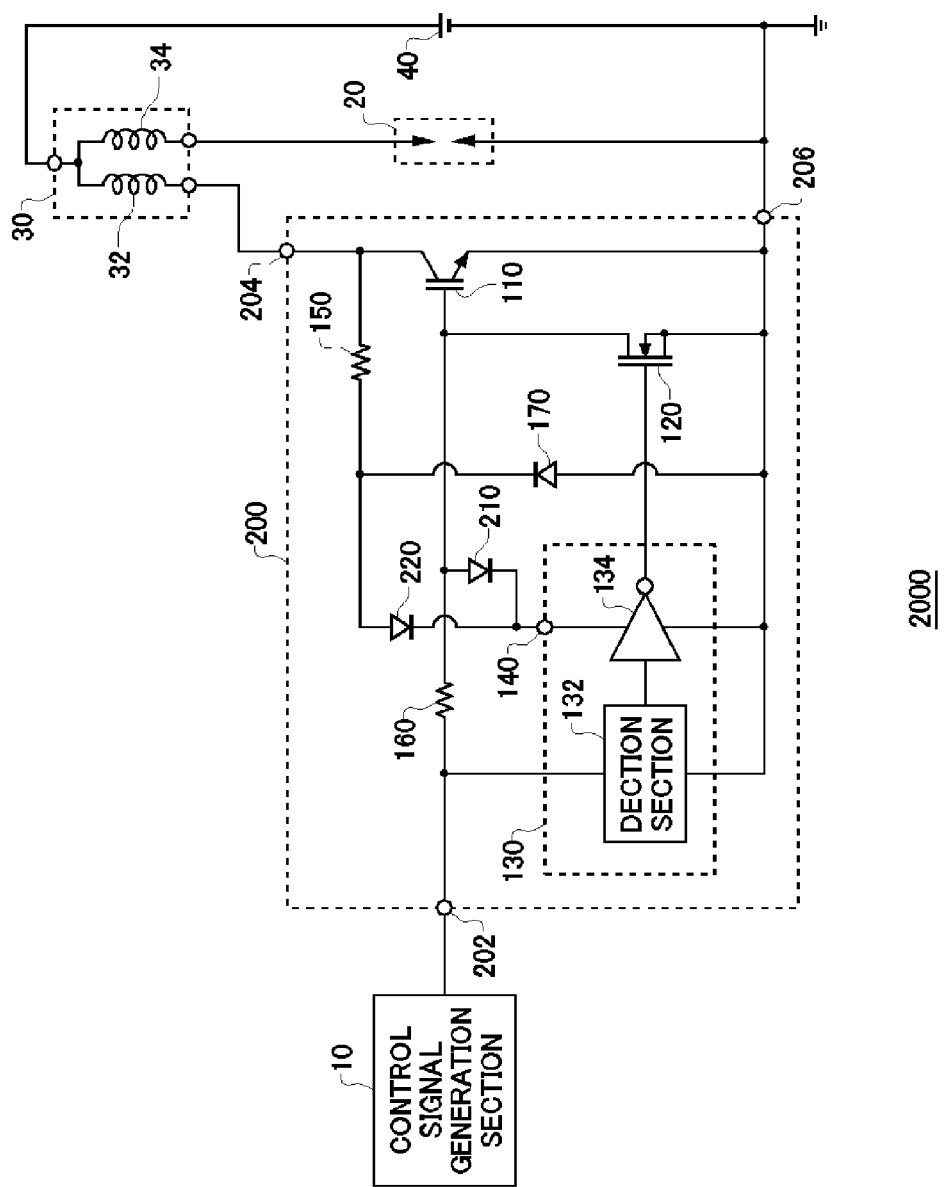
FIG. 10 shows a second modification example of the ignition apparatus 2000 according to the present embodiment.

FIG. 10 shows a second modification example of the ignition apparatus 2000 according to the present embodiment. In the ignition apparatus 2000 of the second modification example, operations approximately the same as those of the ignition apparatus 2000 according to the present embodiment shown in FIG. 3 are given with the same reference signs, and the descriptions for them are omitted. An example is shown in the semiconductor apparatus 200 of the second modification example, where the input terminal 140 of the cut-off condition detection section 130 is connected to the first terminal 204 and the gate terminal of the power semiconductor element 110, and connected to the control terminal 202 via a resistive element.

That is, similar to the example of FIG. 3, in the semiconductor apparatus 200, the input terminal 140 is connected to the first terminal 204 via the second rectifying element 220 and the resistance 150. Also, the input terminal 140 is connected to the gate terminal of the power semiconductor element 110 via the first rectifying element 210. Also, the input terminal 140 is connected to the control terminal 202 via the first rectifying element 210 and the resistive element. That is, the first rectifying element 210 is connected between the resistive element and the input terminal 140; also, the first rectifying element 210 is connected between the gate terminal of the power semiconductor element 110 and the input terminal 140. Note that the resistive element is a resistance or a switch element. FIG. 10 shows an example where the resistive element is the resistance 160.

In this way, in the ignition apparatus 2000 of the second modification example, a resistance value between the gate terminal of the power semiconductor element 110 and the input terminal 140 becomes lower compared to a resistance value between the control terminal 202 and the input terminal 140. Therefore, in a case where the voltage of the control terminal 202 becomes 0V and the charges, which are transiently charged by the gate, and the mirror current flow from the gate terminal to the control terminal 202, the potential of the input terminal 140 of the semiconductor apparatus 200 becomes higher by an amount of the voltage drop of the resistance 160, compared to the semiconductor apparatus 100 shown in FIG. 1.

That is, even if the collector voltage Vc of the power semiconductor element 110 is a low voltage about Vc1 and the voltage of the control terminal 202 becomes 0V, according to the flow of the mirror current, the signal output section 134 can receive the power source voltage corresponding to the voltage drop of the resistance 160 from the input terminal 140. In this case, the signal output section 134 can output the voltage in accordance with the resistance value of the resistance 160 as the cut-off circuit control signal Vs. A transient response of the semiconductor apparatus 200 of such a second modification example will be described in the followings.

Figure 11:
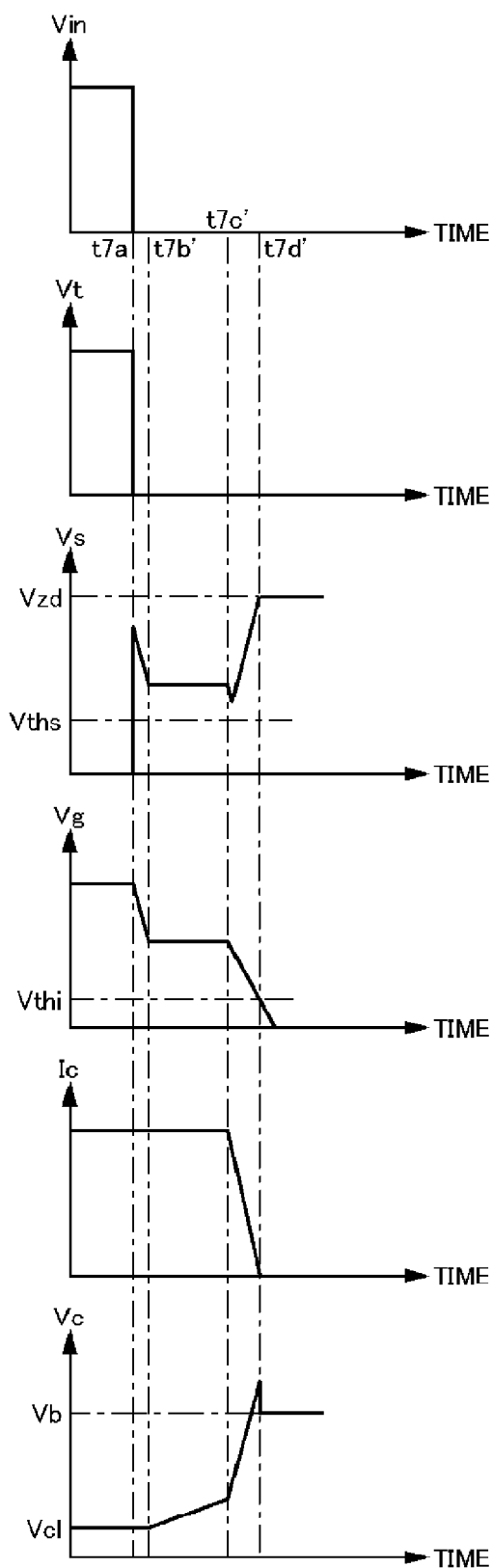
FIG. 11 shows one example of operation waveforms of each section of the semiconductor apparatus 200 of the second modification example.

FIG. 11 shows one example of the operation waveforms of each section of the semiconductor apparatus 200 of the second modification example. FIG. 11 shows one example of the operation waveforms in a case where the control signal Vin shown in the operation waveforms shown in FIG. 8 is input to the control terminal 202. Note that the horizontal axis and the vertical axis in FIG. 11 are shown by approximately the same scale as the horizontal axis and the vertical axis of the operation waveforms shown in FIG. 9.

That is, in FIG. 11, the horizontal axis indicates time and the vertical axis indicates voltage values or current values. Also, FIG. 11 shows respective time waveforms, where "Vin" indicates the control signal input from the control terminal 202, "Vt" indicates the detection signal output by the detection section 132, "Vs" indicates the cut-off circuit control signal output by the signal output section 134, "Vg" indicates the potential of the gate terminal of the power semiconductor element 110, "Ic" indicates the collector current of the power semiconductor element 110, and "Vc" indicates the collector voltage of the power semiconductor element 110.

In FIG. 11, the time when the control signal Vin becomes OFF is set as t7a. The detection signal Vt output by the detection section 132 becomes the low potential at the time t7a according to the control signal Vin. As the control signal Vin becomes OFF, the gate potential Vg of the power semiconductor element 110 is gradually lowered as shown in a period from the time t7a to a time t7b'.

Here, the potential of the input terminal 140 becomes higher than the potential (i.e., 0V) of the control terminal 202 by the amount of the voltage drop of the resistance 160. Therefore, during the period from the time t7a to the time t7b', the cut-off circuit control signal Vs can be set to a voltage value larger than the control signal Vs during the period from the time t7a to the time t7b shown in FIG. 9. Specifically, the semiconductor apparatus 200 can set the cut-off circuit control signal Vs during the period from the time t7a to the time t7b' larger than a threshold Vths of the cut-off circuit 120 according to the setting of the resistance value of the resistance 160. Accordingly, since the cut-off circuit 120 becomes the ON state, the speed at which the gate potential Vg decreases becomes faster than the decrease speed of the gate potential Vg shown in FIG. 9. That is, the time t7b' when the power semiconductor element 110 is pinched off becomes an early time compared to the time t7b.

Similar to the example of FIG. 9, as the power semiconductor element 110 is pinched off and the collector voltage Vc increases, the mirror current flows from the collector to the gate and the decrease of the gate potential Vg is stopped. in FIG. 11, a period when the gate potential Vg is maintained in an approximately constant voltage is set as a period from the time t7b' to a time t7c'. During the period from the time t7b' to the time t7c', since the cut-off circuit control signal Vs can be kept in a state larger than the threshold Vths, the cut-off circuit 120 can be maintained in the ON state.

Accordingly, the amount of the mirror current flowing from the gate of the power semiconductor element 110 via the cut-off circuit 120 can be larger and the increase speed of the collector voltage Vc can be set faster than the increase speed of the collector voltage Vc shown in FIG. 9. That is, the period until the mirror current of the power semiconductor element 110 is stopped (the period from the time t7b' to the time t7c') becomes shorter compared to the period from the time t7b to the time t7c shown in FIG. 9.

As the mirror current of the power semiconductor element 110 is stopped, the gate potential Vg is lowered until reaching 0V. in FIG. 11, a period when the gate potential Vg is lowered to the threshold Vthi is set as a period from the time t7c' to a time t7d'. Along with such a decrease of the gate potential Vg, the cut-off circuit control signal Vs and the collector voltage Vc increase and the collector current Ic decreases. As the gate potential Vg of the power semiconductor element 110 becomes 0V, similar to the example of FIG. 9, the cut-off circuit control signal Vs, the collector current Ic, and the collector voltage Vc, after drastically increasing, respectively become equal to the voltage Vzd, 0 A, and the voltage Vb.

As described above, the semiconductor apparatus 200 can set the gate potential Vg smaller than the threshold Vthi at the time t7d' which is earlier than the time t7d. That is, since the semiconductor apparatus 200 of the second modification example can set the period from the time t7a to the time t7c' shorter compared to the period from the time t7a to the time t7c of the semiconductor apparatus 100 shown in FIG. 9, the cut-off time can be shortened.

Figure 12:
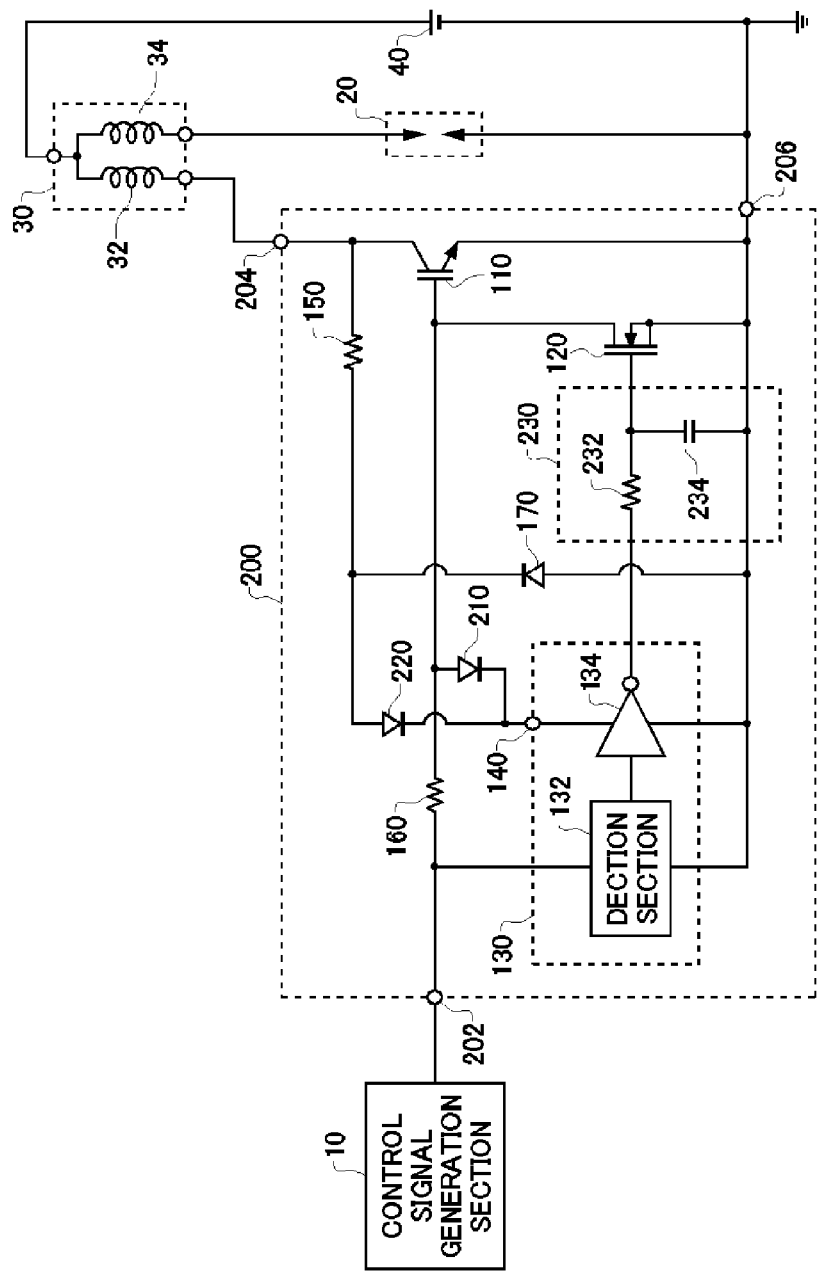
FIG. 12 shows a third modification example of the ignition apparatus 2000 according to the present embodiment.

FIG. 12 shows a third modification example of the ignition apparatus 2000 according to the present embodiment. In the ignition apparatus 2000 of the third modification example, operations approximately the same as those of the ignition apparatus 2000 according to the second modification example shown in FIG. 11 are given with the same reference signs, and the descriptions for them are omitted.

The ignition apparatus 2000 according to the third modification example further includes a delay circuit 230.

The delay circuit 230 is provided between the cut-off condition detection section 130 and the cut-off circuit 120 to delay a signal transmitted to the cut-off circuit 120 by the cut-off condition detection section 130. The delay circuit 230 may have a resistive element and a capacitive element. Also, the delay circuit 230 may have an inductance element and a capacitive element. The delay circuit 230 may be a filter circuit and the like to lower a high frequency component of a noise and the like. FIG. 12 shows an example where the delay circuit 230 has a resistance 232 and a capacitor 234.

In this case, the delay circuit 230 delays a signal passing through the delay circuit 230 by a delay time determined in response to a resistance value of the resistance 232 and a capacitance value of the capacitor 234. That is, the cut-off circuit control signal Vs output from the signal output section 134 of the cut-off condition detection section 130 is delayed by the delay circuit 230 and then input into the cut-off circuit 120. Accordingly, in a case where the power semiconductor element 110 is in the ON state, even if the cut-off circuit control signal Vs output from the signal output section 134 temporarily becomes the high potential, as the cut-off circuit control signal Vs becomes the low potential in a shorter time than the delay time, the power semiconductor element 110 can be prevented from being switched to the OFF state.

For example, a malfunction of the cut-off condition detection section 130 may occur due to a noise and the like and the cut-off circuit control signal Vs may suddenly become the high potential in some cases. In such a case, according to the ignition apparatus 2000 of the third modification example, if the cut-off circuit control signal Vs returns back to the low potential in a shorter time than the delay time, the malfunction of the power semiconductor element 110 can be prevented. A transient response of such an ignition apparatus 2000 of the third modification example is described next.

Figure 13:
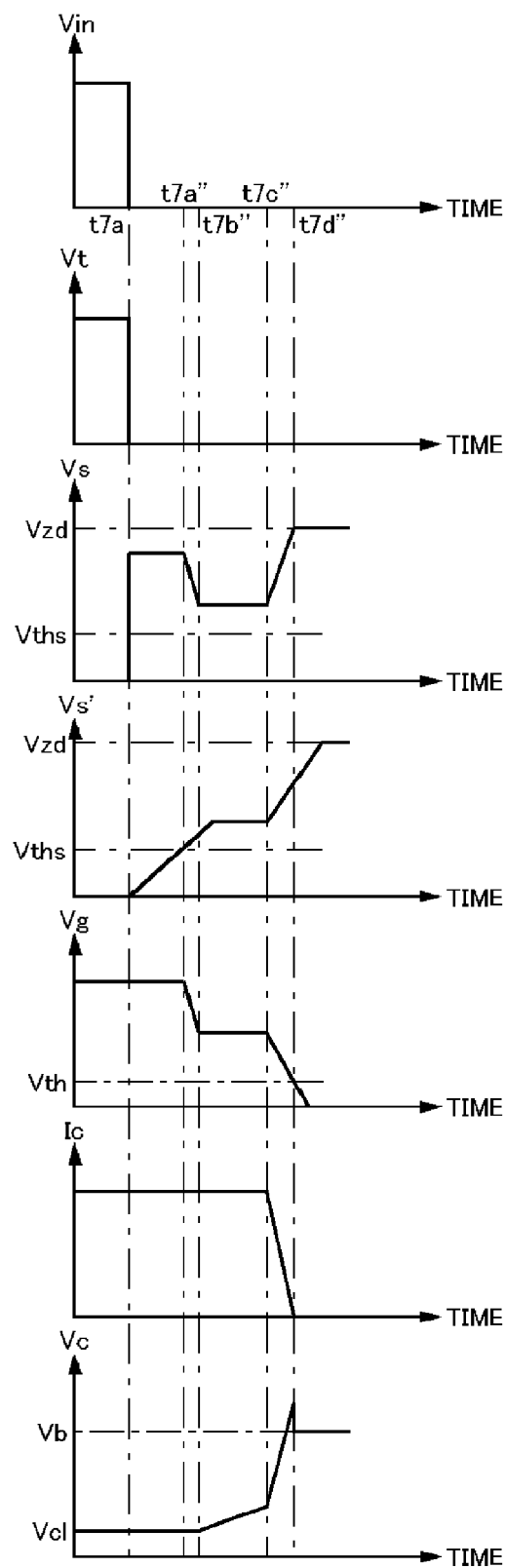
FIG. 13 shows one example of operation waveforms of each section of the semiconductor apparatus 200 of the third modification example.

FIG. 13 shows one example of operation waveforms of each section of the semiconductor apparatus 200 of the third modification example. Similar to FIG. 11, FIG. 13 shows one example of operation waveforms in a case where the control signal Vin shown in the operation waveforms shown in FIG. 8 is input into the control terminal 202. Note that it is assumed that the horizontal axis and the vertical axis of FIG. 13 are shown in approximately the same scale as that of the horizontal axis and the vertical axis of the operation waveforms shown in FIG. 9.

That is, the horizontal axis of FIG. 13 refers to time and the vertical axis of FIG. 13 refers to voltage values or current values. Also, FIG. 13 shows respective time waveforms, where "Vin" indicates the control signal input from the control terminal 202, "Vt" indicates the detection signal output by the detection section 132, "Vs" indicates the cut-off circuit control signal output by the signal output section 134, "Vs'" indicates the cut-off circuit control signal input into the gate of the cut-off circuit 120, "Vg" indicates the potential of the gate terminal of the power semiconductor element 110, "Ic" indicates the collector currents of the power semiconductor element 110, and "Vc" indicates the collector voltage of the power semiconductor element 110.

In FIG. 13, a time at which the control signal Vin becomes OFF is set as t7a. The detection signal Vt output by the detection section 132 becomes the low potential at the time t7a in response to the control signal Vin. The cut-off circuit control signal Vs output by the signal output section 134 becomes the high potential in response to the control signal Vin becoming OFF. Here, since the delay circuit 230 has been provided between the signal output section 134 and the cut-off circuit 120, the cut-off circuit control signal Vs' input into the gate of the cut-off circuit 120 is gradually increased in response to a time constant determined by the resistance 232 and the capacitor 234.

Then, at a time t7a', as the cut-off circuit control signal Vs' input into the gate of the cut-off circuit 120 reaches a threshold Vths of the cut-off circuit 120, the cut-off circuit 120 transits to the ON state. In response to the cut-off circuit 120 transiting to the ON state, the gate potential Vg of the power semiconductor element 110 is gradually decreased during a period from the time t7a' to a time t7b". Note that the time t7b" may be approximately the same time as a time delayed from the time t7b' shown in FIG. 11 by the delay time of the delay circuit 230. Similarly, each of a time t7c" and a time t7d" shown in FIG. 13 may be approximately the same time as a time delayed from each of the time t7c' and the time t7d' shown in FIG. 11 by the delay time of the delay circuit 230.

Also, since the semiconductor apparatus 200 of the third modification example is a configuration where the delay circuit 230 is added to the semiconductor apparatus 200 of the second modification example, the operation waveforms of each section after the time t7b" becomes the operation waveforms similar to the operation waveforms of each section after the time t7b' shown in FIG. 11. Note that the cut-off circuit control signal Vs' input into the gate of the cut-off circuit 120 becomes a waveform where the cut-off circuit control signal Vs output by the signal output section 134 is delayed in response to the time constant. Also, the cut-off circuit control signal Vs of FIG. 13 shows an example where the high frequency signal is removed through a filtering effect according to the delay circuit 230, compared to the cut-off circuit control signal Vs of FIG. 12.

As described above, by adding the delay circuit 230, the semiconductor apparatus 200 of the third modification example can prevent the malfunction of the power semiconductor element 110 from occurring even if the noise having a pulse width shorter than the delay time is mixed into the cut-off circuit control signal Vs while executing the operations approximately similar to the operations of the semiconductor apparatus 200 of the second modification example.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor apparatus, comprising:
 a power semiconductor element which is connected between a first terminal on a high-potential side and a second terminal on a low-potential side and is controlled to be turned on or off according to a gate potential;
 a cut-off condition detection section which detects whether or not a control signal that is input from a control terminal and controls the power semiconductor element satisfies a predetermined cut-off condition;
 a cut-off circuit which controls the gate potential of the power semiconductor element to be an OFF potential in response to the cut-off condition detection section detecting that the cut-off condition is satisfied, wherein the cut-off condition detection section has an input terminal which is connected to the first terminal and the control terminal and uses an electrical signal input from the input terminal as a power source;
 a first rectifying element which is connected between the control terminal and the input terminal of the cut-off condition detection section; and
 a second rectifying element which is connected between the first terminal and the input terminal of the cut-off condition detection section;
 wherein the cut-off condition detection section has:
 a detection section which detects whether or not the control signal exceeds a predetermined threshold, and
 a signal output section which outputs a cut-off control signal that controls the cut-off circuit according to a detection result of the detection section.

2. A semiconductor apparatus, comprising:
 a power semiconductor element which is connected between a first terminal on a high-potential side and a second terminal on a low-potential side and is controlled to be turned on or off according to a gate potential;
 a cut-off condition detection section which detects whether or not a control signal that is input from a control terminal and controls the power semiconductor element satisfies a predetermined cut-off condition;
 a cut-off circuit which controls the gate potential of the power semiconductor element to be an OFF potential in response to the cut-off condition detection section detecting that the cut-off condition is satisfied, wherein the cut-off condition detection section has
 an input terminal which is connected to the first terminal and a gate terminal of the power semiconductor element and, is connected to the control terminal via a resistive element, and uses an electrical signal input from the input terminal as a power source;
 a first rectifying element which is connected between the resistive element and the input terminal of the cut-off condition detection section; and
 a second rectifying element which is connected between the first terminal and the input terminal of the cut-off condition detection section;
 wherein the cut-off condition detection section has:
 a detection section which detects whether or not the control signal exceeds a predetermined threshold, and
 a signal output section which outputs a cut-off circuit control signal that controls the cut-off circuit according to a detection result of the detection section.

3. The semiconductor apparatus according to claim 2, wherein
 the resistive element is a resistance or a switch element.

4. The semiconductor apparatus according to claim 1, wherein the signal output section is connected to the first rectifying element and the second rectifying element and uses an electrical signal input from the first terminal and the control terminal as a power source.

5. The semiconductor apparatus according to claim 1, wherein a resistance or a switch element is connected between the first terminal and the second rectifying element.

6. The semiconductor apparatus according to claim 1, wherein
the cut-off circuit electrically connects a gate and an emitter of the power semiconductor element to set the gate of the power semiconductor element to an OFF potential.

7. The semiconductor apparatus according to claim 1, wherein
the power semiconductor element is an IGBT (insulated gate bipolar transistor) or a vertical MOSFET.

8. The semiconductor apparatus according to claim 1, further comprising
a delay circuit which is provided between the cut-off condition detection section and the cut-off circuit and delays a signal transmitted to the cut-off circuit by the cut-off condition detection section.

9. The semiconductor apparatus according to claim 1, wherein
the semiconductor apparatus is an igniter which controls currents flowing through an ignition coil according to a control signal from outside.

10. The semiconductor apparatus according to claim 2, wherein the signal output section is connected to the first rectifying element and the second rectifying element and uses an electrical signal input from the first terminal and the control terminal as a power source.

11. The semiconductor apparatus according to claim 2, wherein a resistance or a switch element is connected between the first terminal and the second rectifying element.

12. The semiconductor apparatus according to claim 2, wherein
the cut-off circuit electrically connects a gate and an emitter of the power semiconductor element to set the gate of the power semiconductor element to an OFF potential.

13. The semiconductor apparatus according to claim 2, wherein
the power semiconductor element is an IGBT (insulated gate bipolar transistor) or a vertical MOSFET.

14. The semiconductor apparatus according to claim 2, further comprising
a delay circuit which is provided between the cut-off condition detection section and the cut-off circuit, and delays a signal transmitted to the cut-off circuit by the cut-off condition detection section.

15. The semiconductor apparatus according to claim 2, wherein the semiconductor apparatus is an igniter which controls currents flowing through an ignition coil according to a control signal from outside.

\* \* \* \* \*